United States Patent
Wallace

(10) Patent No.: US 6,801,097 B2
(45) Date of Patent: Oct. 5, 2004

(54) WIDEBAND VCO RESONANT CIRCUIT METHOD AND APPARATUS

(75) Inventor: Raymond C. Wallace, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 10/199,898

(22) Filed: Jul. 18, 2002

(65) Prior Publication Data

US 2004/0012454 A1 Jan. 22, 2004

(51) Int. Cl.[7] .................................................. H03B 5/08
(52) U.S. Cl. ................. 331/179; 331/177 V; 331/36 R; 331/36 C
(58) Field of Search ................................. 331/179, 181, 331/177 V, 167, 36 R, 36 C, 36 L

(56) References Cited

U.S. PATENT DOCUMENTS

| | | | |
|---|---|---|---|
| 20,875 A | 9/1858 | Jansson | 331/44 |
| 3,573,355 A | * 4/1971 | Cavelos | 455/253.2 |
| 3,697,890 A | * 10/1972 | Healey et al. | 331/116 R |
| 4,106,022 A | * 8/1978 | Last | 342/394 |
| 4,266,295 A | * 5/1981 | Bach, Jr. | 455/158.2 |
| 4,353,038 A | 10/1982 | Rose et al. | 331/36 C |
| 4,736,169 A | * 4/1988 | Weaver et al. | 331/117 R |
| 4,990,866 A | * 2/1991 | Martheli | 331/99 |
| 5,905,414 A | 5/1999 | Motoi | 332/130 |
| 6,009,318 A | * 12/1999 | Freed | 455/326 |
| 6,268,778 B1 | 7/2001 | Mucke et al. | 331/117 R |
| 6,348,841 B1 | * 2/2002 | See | 331/167 |
| 6,396,356 B1 | * 5/2002 | Mehta et al. | 331/36 C |
| 6,472,956 B2 | * 10/2002 | Kosuga | 333/174 |

FOREIGN PATENT DOCUMENTS

| | | | |
|---|---|---|---|
| EP | 0899866 A1 | 3/1999 | H03B/5/12 |
| FR | 2612017 | 3/1987 | H03B/5/12 |
| GB | 2223903 A | 3/1989 | H03B/5/12 |
| GB | 2241846 A | * 9/1991 | H03C/3/22 |

* cited by examiner

Primary Examiner—Timothy P. Callahan
Assistant Examiner—An T. Luu
(74) Attorney, Agent, or Firm—Philip Wadsworth; Charles D. Brown; Howard H. Seo

(57) ABSTRACT

A wideband Voltage Controlled Oscillator (VCO) uses a resonant circuit tunable over a wide range of resonant frequencies. The resonant circuit includes voltage variable elements such that the resonant frequency, and thus the frequency of oscillation, may be electronically tuned. The voltage variable elements are arranged such that multiple control voltages determine the resonant frequency. A first control voltage is applied to a first set of tuning elements and operates as a coarse control of the resonant frequency. A second control voltage is applied to a second set of tuning elements and operates as a fine control of the resonant frequency. Using multiple control voltages on multiple elements allows for a wideband VCO while maintaining a low VCO gain.

11 Claims, 3 Drawing Sheets

WIDEBAND VCO RESONANT CIRCUIT METHOD AND APPARATUS

BACKGROUND OF THE INVENTION

1. Field of the Invention

The invention relates to electronic circuits. More particularly, the invention relates to wideband Voltage Controlled Oscillator (VCO) and resonant circuits used therein.

2. Description of the Related Art

Oscillators are used in many electronic devices to provide a frequency source. Oscillators are used in receivers and transmitters as frequency references or as local oscillators used to frequency convert signals. An oscillator uses a gain element, or amplifier, in conjunction with positive feedback to create a regenerative signal. The resulting oscillator has a frequency output where the gain is greater than or equal to, unity and the phase of the feedback signal is equal to zero. A frequency sensitive phase shifting circuit, or element, is often placed in the feedback path to create a particular frequency of oscillation. One such frequency sensitive phase shifting circuit is a resonant circuit, also referred to as a tank circuit.

A Voltage Controlled Oscillator (VCO) is a tunable oscillator. The output of the VCO is a signal at a frequency that may be characterized by the equation $\omega(t)=\omega_0+Ku(t)$, where $\omega(t)$ represents the angular frequency of the VCO, $\omega_0$ represents an initial frequency, or center frequency, of the VCO, K is the VCO gain, and u(t) is the control voltage signal. The resonant circuit largely determines the frequency of oscillation and a tuning sensitivity of the resonant circuit largely determines the VCO gain.

To create a VCO, the resonant circuit is comprised of at least one variable component. The reactance of the variable component is a function of a control signal, typically a voltage level, so that the frequency of zero phase, and consequently the frequency of oscillation, is also variable. If the VCO is required to tune over a large frequency range, the variable component must be capable of tuning the resonant circuit over the large frequency range. Possible circuit implementations for a variable resonant circuit capable of covering a large frequency range include a resonant circuit incorporating a highly sensitive variable component or a resonant circuit requiring an extended control voltage range. The first alternative presents some problems because the VCO gain (K), typically measured in terms of MHz/Volt for a radio frequency (RF) oscillator, becomes very high. A high VCO gain results in large frequency changes for relatively small control voltage changes and makes the VCO more susceptible to noise induced on the tuning input, or control line. The second alternative also has disadvantages because the required control voltage range is very large. Large control voltages may present a problem in battery powered electronics having limited supply voltage ranges.

Because the resonant circuit tunes the oscillator to the desired operating frequency, the quality factor (Q) of the resonant circuit is important in maintaining a specific output frequency at a given control voltage level. A lower circuit Q generates a more gentle phase response, whereas a higher circuit Q generates a sharper phase response. A higher circuit Q is desirable to minimize the effects of small phase variations on output frequency. For a given phase variation, the change in VCO output frequency is more pronounced in the circuit having the lower circuit Q. The magnitude of the frequency change in a low Q circuit for a given phase variation is greater than the magnitude of the frequency change in a high Q circuit for the same phase variation.

As noted above, a VCO using a resonant circuit to establish its output frequency may be used in a variety of communication devices, such as a receiver or transmitter incorporated into a wireless phone. The receiver or transmitter may be required to operate over multiple bands or an extended frequency range. The multiple frequency bands may be contiguous or may be disjoint. Furthermore, the receiver or transmitter may be battery powered and have a limited voltage range over which a resonant circuit may be tuned. Thus, what is needed is a VCO or a resonant circuit for a VCO that tunes over a wide range of frequencies, is insensitive to noise, and that requires a limited control voltage range.

SUMMARY OF THE INVENTION

A wideband VCO and method for generating a frequency signal tunable over a wideband are disclosed. The wideband VCO uses a resonant circuit tunable over a wide range of resonant frequencies. The resonant circuit includes voltage variable elements such that the resonant frequency, and thus the frequency of oscillation, may be electronically tuned. The voltage variable elements are arranged such that multiple control voltages determine the resonant frequency. A first control voltage is applied to a first set of tuning elements and operates as a coarse control of the resonant frequency. A second control voltage is applied to a second set of tuning elements and operates as a fine control of the resonant frequency.

The first control voltage determines a frequency band of operation and the second control signal determines the frequency of operation within the frequency band determined by the first control signal. The wideband VCO may be implemented within a frequency synthesizer or may be implemented as a frequency source within a wireless communication device, such as a wireless phone.

BRIEF DESCRIPTION OF THE DRAWINGS

The features, objects, and advantages of the invention will become more apparent from the detailed description set forth below when taken in conjunction with the drawings in which like reference characters identify correspondingly throughout and wherein.

DETAILED DESCRIPTION OF EMBODIMENTS OF THE INVENTION

Figure 1:
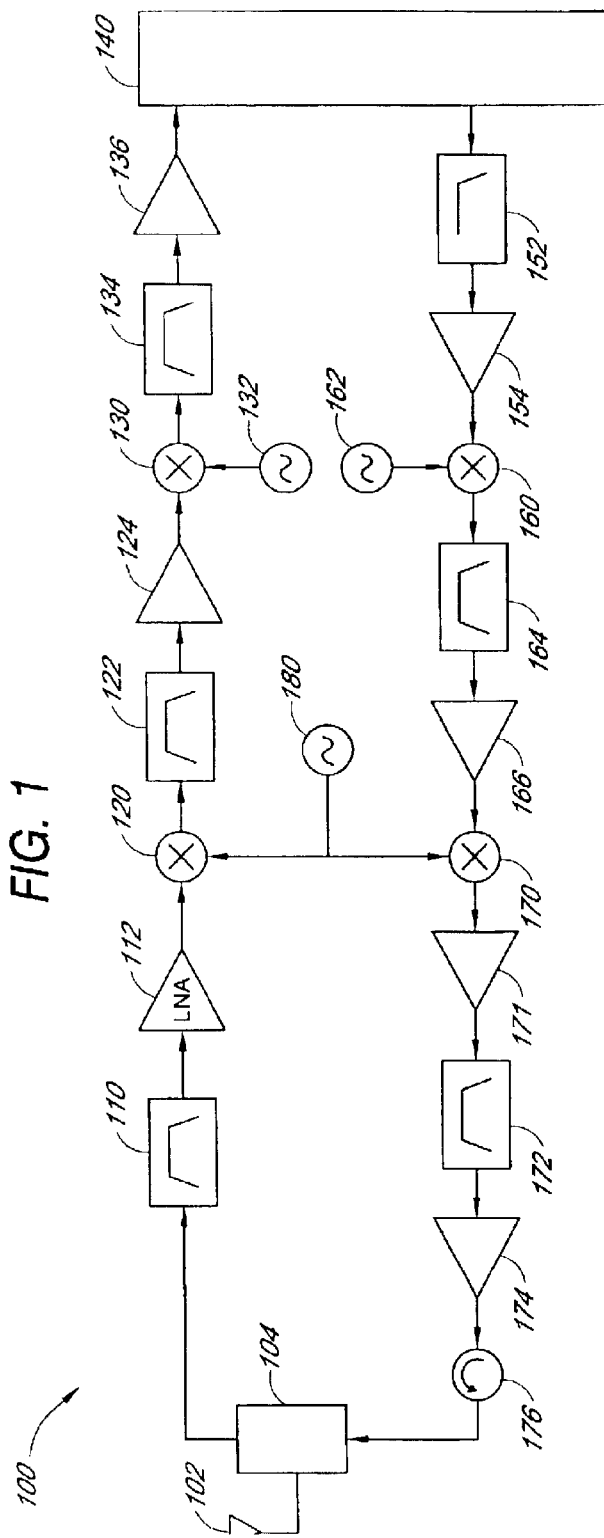
FIG. 1 is a functional block diagram of a wireless transceiver having a VCO according to the invention.

The following embodiments disclose apparatus and methods for overcoming the difficulties experienced in the past when creating a VCO having a resonant circuit that is tunable over a wide range of frequencies. FIG. 1 shows a functional block diagram of a wireless transceiver 100 that uses at least one wideband VCO as described subsequently. The wireless transceiver 100 may be a wireless phone such as may be capable of communicating over one, or a plurality of wireless communication systems.

An antenna 102 provides the interface between the wireless transceiver 100 and the wireless channel. A signal received by the wireless transceiver 100 is coupled by the antenna 102 to a duplexer 104. A duplexer 104 operates to electrically isolate the transmit portion of the transceiver 100 from the receiver portion. Typically, the duplexer 104 allows a signal in the receive frequency band to be coupled from an antenna port to a receive port with minimal attenuation. Additionally, the duplexer allows a signal in the transmit frequency band to be coupled from the transmit port to the antenna port with minimal attenuation. However, signals at the antenna port of the duplexer that are outside of the receive frequency band, particularly signals in the transmit frequency band, are greatly attenuated prior to reaching the receive port of the duplexer 104. Thus, the receiver is electrically isolated from the transmitter signals while allowing received signals from the antenna 102 to be coupled to the receiver and signals from the transmitter to be coupled to the antenna 102.

The received signals at the receive port of the duplexer 104 are electrically coupled to an RF filter 110. The RF filter 110 typically passes the entire receive frequency band while attenuating out of band signals. Additionally, the RF filter 110 typically has minimal passband attenuation in order to minimize the receiver noise figure, which is a figure of merit. The signals output from the RF filter 110 are coupled to a Low Noise Amplifier (LNA) 112. The LNA 112 amplifies the received signal and is the component responsible for characterizing the receiver noise figure. The amplified output from the LNA 112 is coupled to an RF mixer 120. A Local Oscillator (LO) signal is coupled from an oscillator 180 to an LO port of the RF mixer 120.

The oscillator 180 may be a tunable oscillator as described in the embodiments below. The oscillator 180 may be a synthesized oscillator that tunes to a frequency of operation depending on the desired frequency of the received signal. Although the oscillator 180 is shown in FIG. 1 as directly connected to the RF mixer 120, it may be appreciated that the electrical connection from the output of the oscillator 180 to the RF mixer 120 may be implemented using amplifiers, filters, attenuators, or any combination of signal processing or coupling elements.

The received signal from the LNA 112 and the output from the oscillator 180 are frequency converted in the RF mixer 120. The output of the RF mixer 120 is typically an Intermediate Frequency (IF) signal having a fixed center frequency. However, the IF center frequency may be a variable frequency depending on the relationship of the center frequency of the received signal to the center frequency of the oscillator 180 output. The IF output from the RF mixer 120 is coupled to an IF filter 122.

The IF filter 122 typically has a narrower passband compared to the RF filter 110. The IF filter 122 is used to attenuate signals that are outside the bandwidth of interest. The IF filter 122 typically has a passband approximately equal to a bandwidth of a single channel when the IF center frequency is fixed.

The output of the IF filter 122 is coupled to an IF amplifier 124 where the signal is amplified. The IF amplifier 124 may be a variable gain amplifier as part of an Automatic Gain Control (AGC) circuit. The output of the IF amplifier 124 is coupled to an IF mixer 130.

The LO port of the IF mixer 132 is driven by an output of a receive IF LO 132. The receive IF LO 132 is typically a fixed frequency oscillator, although a variable frequency oscillator may be used in situations where the receive IF center frequency is not fixed.

The receive IF LO 132 output and the receive IF signal are frequency converted in the IF mixer 130. The desired output of the IF mixer 130 is typically a baseband signal. The baseband signal is coupled from the output of the IF mixer 130 to a baseband filter 134. The baseband filter 134 attenuates undesired signals and passes the frequencies of interest.

The output of the baseband filter 134 is coupled to a baseband amplifier 136. The baseband amplifier 136 is used to amplify the signal before coupling it to a baseband processor 140. The baseband processor 140 performs subsequent signal processing on the baseband signal. The processing may include demodulation of the received signal as well as routing the extracted information to a desired destination. For example, received voice signals may be coupled to a loudspeaker (not shown) to be broadcast to a user, or received command signals may be coupled to appropriate registers within the wireless transceiver 100.

The transmitter portion of the wireless transceiver 100 operates in a complementary manner to the receiver. Baseband transmit signals from the baseband processor 140 are coupled to a baseband filter 152. For example, the transmit signals may be modulated voice or data signals. The baseband processor 140 may receive signals from an external source (not shown) and perform analog to digital conversion as well as signal modulation and forward error correction. The baseband filter 152 band limits the signal output from the baseband processor 140 and couples the filtered signal to a baseband amplifier 154.

The amplified baseband signal is coupled to an input of a transmit IF mixer 160. The LO port of the transmit IF mixer 160 is driven by an output from a transmit IF LO 162. The transmit IF mixer 160 frequency converts the baseband transmit signal to a transmit IF. The transmit IF may be at a fixed center frequency or may be at a variable center frequency. The output of the transmit IF mixer 160 is coupled to a transmit IF filter 164. The transmit IF filter 164 typically is used to remove noise and undesired mixer frequency components.

The filtered transmit IF signal is then coupled to an IF amplifier 166. The IF amplifier 166 in the transmit path is used to amplify the transmit signal. The IF amplifier 166 may have a variable gain and may form a part of a transmit automatic gain control loop (not shown). The amplified transmit IF signal is coupled to a transmit RF mixer 170.

The transmit RF mixer 170 also receives an LO signal from the oscillator 180 used to provide a receive LO. It may be appreciated that the receive and transmit IF center frequencies may be chosen such that a single oscillator 180 may be used as an LO for the transmit RF upconversion as well as for the receive RF downconversion. It may also be appreciated that individual oscillators for the transmit and receive path may be used in lieu of a single oscillator 180.

The output of the transmit RF mixer 170 is a signal at the transmit RF center frequency. The transmit RF signal is coupled from the output of the transmit RF mixer 170 to a driver amplifier 171. The driver amplifier is used to amplify the transmit RF signals prior to amplification in final power amplifier. Additionally, the driver amplifier 171 may form a part of a transmit automatic gain control loop (not shown) that is used to control the transmit power. The transmit RF signal from the output of the driver amplifier 171 is coupled to a transmit RF filter 172 that may be used to remove undesired mixer products as well as undesired products generated in the driver amplifier 171. The filtered transmit RF signal is coupled to an RF amplifier 174 that typically is a high powered amplifier. The output of the RF amplifier 174 is coupled to a circulator or isolator 176. The circulator or isolator 176 is used to provide a constant load to the RF amplifier 176 and to isolate the output of the amplifier 174 from incident or reflected signals. The output of the isolator 176 is coupled to the duplexer 104 that couples the transmit RF signal to the antenna 102 to be communicated to the destination.

Figure 2:
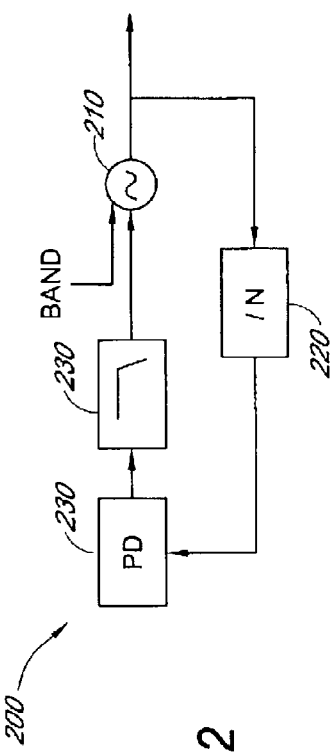
FIG. 2 is a functional block diagram of a frequency synthesizer having a VCO according to the invention.

FIG. 2 shows a functional block diagram of a frequency synthesizer 200 such as may be used for the oscillator 180 shown in FIG. 1. The frequency synthesizer 200 may be implemented in a wireless communication device, such as a wireless phone. It may be desirable for the wireless phone to be able to operate in a plurality of frequency bands. For example, a wireless phone may be configured to operate in a cellular frequency band as well as a PCS frequency band. Additionally, it may be desirable for the wireless phone to also operate in GSM, personal handyphone, or some other communication band or some combination of communication frequency bands. Rather than implementing multiple VCO's, each having the capability to operate in a limited frequency band, the VCO 210 may be controlled to operate over all desired bands of operation. The multiple frequency bands may be continuous or may be disjoint. Where there are more than two frequency bands, some frequency bands may be adjacent while others are disjoint. Additionally, any two frequency bands may be overlapping or may be mutually exclusive.

The frequency synthesizer 200 uses a wideband VCO 210, which is described below in more detail. The VCO 210 has a first input that accepts a control signal that determines the frequency band of operation. The band control signal is not typically used to tune the VCO 210 to an exact frequency, but instead, is used to control the VCO 210 output frequency to a particular frequency band of operation. The band control signal may be continuously varied, however, it may be desirable to implement the band control signal as multiple discrete signals, each corresponding to a particular frequency band. A processor (not shown) or some other type of logic circuit may provide the band control signal. The band control signal may be a voltage corresponding to a particular frequency band. A plurality of band control voltages, or the digital representations thereof, may be stored in a memory and recalled and applied to the VCO 210 depending on the desired frequency of operation. Alternatively, the processor may determine the band control signal during operation.

The VCO 210 outputs a frequency in the frequency band determined by the band control signal. The VCO 210 output may also be provided to a divider 220. The divider 220 divides the VCO 210 output frequency to produce a lower frequency for use in a phase lock loop used to determine the desired VCO 210 output frequency. The divider ratio is typically determined by the processor and may, for example, range from one to tens of thousands. The output of the divider 220 is provided as one input to a phase detector 230.

A frequency reference is provided to a second input of the phase detector 230. The frequency reference is typically produced by a stable frequency source such as a crystal oscillator or a temperature controlled crystal oscillator (not shown). The output of the stable frequency source may or may not be divided by a reference frequency divider (not shown) depending on the frequency used by the phase detector 230.

The phase detector 230 compares the phase of the divided VCO 210 output signal with the phase of the signal provided to its reference input. The phase detector 230 outputs a signal that depends on the relative phases. The phase detector 230 output is typically a current or voltage. The output of the phase detector 230 is coupled to a loop filter 240. The loop filter 240 determines the frequency response of the phase locked loop implemented within the frequency synthesizer 200. The output of the loop filter 240 is provided to a second control input of the VCO 210 to tune the output frequency to a specific frequency within the band determined by the band control, or band select, signal. It may be appreciated that when the band select signal is constant, the VCO 210 gain is determined by the sensitivity of the second control input. Thus, the VCO 210 gain may be low while allowing the output frequency to tune over a large range.

FIG. 3 through FIG. 9 shows functional block diagrams of various embodiments of resonant circuits. Throughout these figures, the functional block diagrams have minimized the number of non-tuning elements that may also be included in a VCO using the resonant circuit embodiment. For example, the amplifier connections, T1 and T2 are generally shown as direct connections to the resonant circuit. However, the DC operating point of an amplifier used in an oscillator design may, in some designs, affect the operation of the various tuning elements or of the resonant circuit as a whole. Thus, in these oscillator implementations, a DC blocking capacitor is typically used in series between each amplifier connection and the resonant circuit. The DC blocking capacitor is typically chosen such that it does not affect the tuning characteristics of the resonant circuit.

Additionally, the control voltage connections, V1 and V2, are typically shown as direct connections to the resonant circuit. Devices coupled to the control voltage connections typically do not form a part of the resonant circuit. Thus, an oscillator implementation typically includes a connection from each control voltage connection to AC ground. The AC ground may be implemented as a capacitor from the control voltage connection to ground or voltage common. The capacitor used for the AC ground typically provides an AC ground at least at the resonant frequency. Additionally, the AC ground capacitor should not adversely affect the tuning of the resonant circuit.

Figure 3:
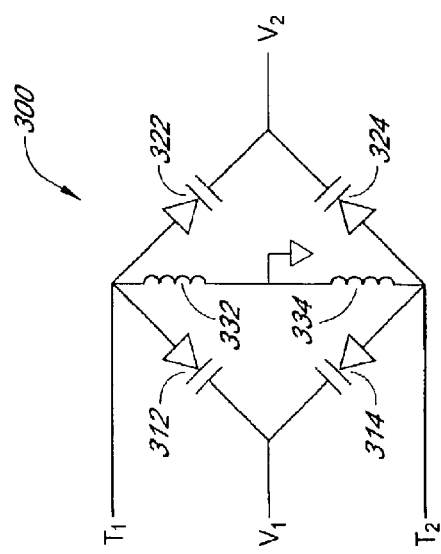
FIG. 3 is a functional block diagram of a balanced resonant circuit embodiment.

FIG. 3 shows a functional block diagram of a resonant circuit 300, which may be used in conjunction with an amplifier or other gain element to produce a VCO. As may be appreciated, a resonant circuit may be implemented as a balanced circuit with the connections to the amplifier appearing as mirror images with respect to a voltage return, voltage common, or signal ground. Alternatively, a resonant circuit may be implemented as a single ended circuit having one signal path that is referenced to voltage return, voltage common, or signal ground.

The resonant circuit 300 shown in FIG. 3 is a balanced circuit having two connections, T1 and T2, for connection to a gain element for generating a VCO. Additionally, the resonant circuit 300 has two inputs, V1 and V2, to receive the control voltage signals.

The resonant circuit 300 may be seen to comprise three reactive elements placed in parallel. The resonant frequency is determined by the parallel resonance of the three reactive elements. A first reactive element comprises a first varactor 312 in series with a second varactor 314. A varactor diode, typically referred to as a varactor, may be viewed as electrically equivalent to a voltage variable capacitor. The value of the capacitance is determined in part on the reverse voltage applied to the varactor diode. Varactors may be configured by the manufacturer to provide a given capacitance for a corresponding voltage. Different models of varactors may provide different capacitance values for the same reverse bias.

The first varactor 312 is arranged such that its anode is electrically connected to the first amplifier connection, T1. The cathode of the first varactor 312 is electrically connected to the cathode of the second varactor 314. The anode of the second varactor 314 is electrically connected to the second amplifier connection, T2. The common electrical connection of the cathodes of the two varactors is used as a first control input.

A second reactance is comprised of a third varactor 332 in series with a fourth varactor 324. The anode of the third varactor is electrically connected to the first amplifier connection, T1, and so is common to the anode of the first varactor 312. The cathode of the third varactor 322 is electrically connected to the cathode of the fourth varactor 324. The anode of the fourth varactor 324 is electrically connected to the second amplifier connection, T2, and thus, to the anode of the second varactor 314. The common connection of the cathodes of the third varactor 332 and the fourth varactor 324 is used as the second control input.

A third reactance is comprised of a first inductor 332 electrically connected in series with a second inductor 334. A first terminal of the first inductor 332 is electrically connected to the first amplifier connection T1. A first terminal of the second inductor 334 is electrically connected to the second amplifier connection T2. The second terminal of the first inductor 332 and the second inductor 334 are electrically connected to a voltage return, voltage common, or ground.

Thus, it may be appreciated that the resonant frequency is determined by the values of each of the reactive components. The band control input may be the first control input or the second control input depending on the choice of varactor values. As an example, let the first control input represent the band select input. A band select voltage is applied to the first control input. The range of capacitance values over which the third and fourth varactors, 332 and 334, may tune is smaller than the range of capacitance tuned by the first and second varactors, 312 and 314. Thus, the band select voltage determines a frequency band over which the resonant circuit 300 may tune. The resonant frequency within the selected frequency band is thus determined by the signal applied at the second control input. If a constant voltage is applied at the first control input, the range of resonant frequencies obtained by using the full tuning range at the second control input represents the frequency band of operation.

It may be appreciated that the choice of first and second varactors, 312 and 314, as well as the choice of first control voltage values determine the tunable range of the resonant circuit 300, and thus a corresponding VCO using the resonant circuit 300. If the first control voltage is allowed to tune over a discrete number of values, it may be seen that a corresponding number of frequency bands are represented. The frequency bands may be adjacent, overlapping, mutually exclusive, or disjoint as determined by the first control voltage. The second control input may be varied continuously over the entire tuning range and thus may be used to connect a VCO to a phase locked loop or frequency synthesizer. The VCO gain is then determined by the second control input. Because the third and fourth varactors, 322 and 324, are configured to tune across a relatively small range of capacitance values, the corresponding VCO gain is low.

The voltages applied to the first and second control voltage inputs may be filtered prior to application at the resonant circuit 300. As noted earlier, a low pass filter may be used within the control loop of a phase locked loop driving the second control voltage input of the resonant circuit 300. A low pass filter may also be used between the control voltage source and the first control voltage input. The low pass filter may be used to filter out undesired noise on the control voltage signal in order to keep the band select signal at a constant value.

Figure 4:
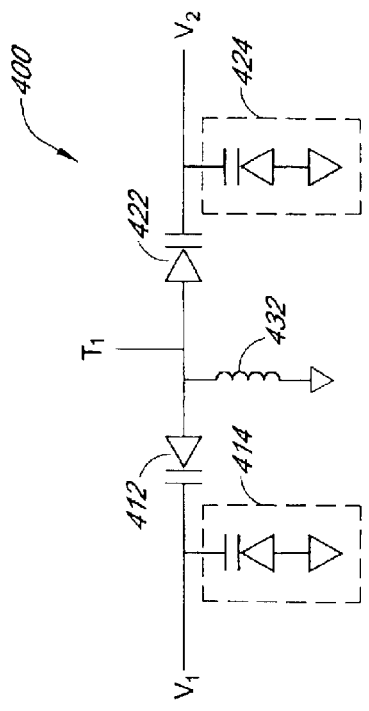
FIG. 4 is a functional block diagram of a single ended resonant circuit embodiment.

FIG. 4 represents a single ended embodiment of a resonant circuit 400. In a single ended design, only one amplifier connection, T1, is present. However, there are still two control voltage inputs, V1 and V2, representing the band select and frequency tuning inputs.

A single inductor 432 is electrically connected between the amplifier connection, T1, and voltage common. As was discussed above, the voltage common may be a voltage return or ground. The cathode of a first varactor 412 is electrically connected to a first control voltage input, V1. The anode of the first varactor 412 is electrically connected to the amplifier connection, T1. The cathode of a second varactor 422 is electrically connected to a second control voltage input. The anode of the second varactor 422 is electrically connected to the amplifier connection, T1.

Optional capacitors 414 and 424 may be implemented to provide AC path to ground for the resonant circuit 400. Alternatively, if the control voltage inputs are filtered, the associated filters (not shown) may provide AC paths to ground for the resonant circuit 400. The capacitors may be chosen such that they affect the tuning operation of the resonant circuit 400 or may be chosen to have little or no affect on the resonant frequency of the resonant circuit 400.

FIG. 4 shows an embodiment where varactors 414 and 424 are used as the capacitors. The varactors 414 and 424 are also tuning elements of the resonant circuit. A third varactor 414 is used as the capacitor from the cathode of the first varactor 412 to voltage common. The anode of the third varactor 414 is electrically connected to voltage common and the cathode of the third varactor 414 is electrically connected to the cathode of the first varactor 412. In this configuration, the first and third varactors 412 and 414 both affect the tuning of the resonant circuit. This configuration of first and third varactors, 412 and 414, may tend to make the reactance less sensitive to the first control voltage. Alternatively, a fixed value capacitor may be used as the capacitor between the first control voltage input and voltage common.

A fourth varactor 424 is used as a capacitor from the second control voltage input to voltage common. The cathode of the fourth varactor 424 is electrically connected to the second control voltage input and the anode of the fourth varactor 424 is electrically connected to voltage common. Alternatively, a fixed value capacitor may be used as the capacitor between the second control voltage input and voltage common.

As may be appreciated by reference to FIG. 4, the inductor 432 and the varactors 412, 422, 414, and 424 form a parallel resonant circuit 400. The resonant frequency of the resonant circuit 400 is determined by the first and second control voltage values.

Figure 5:
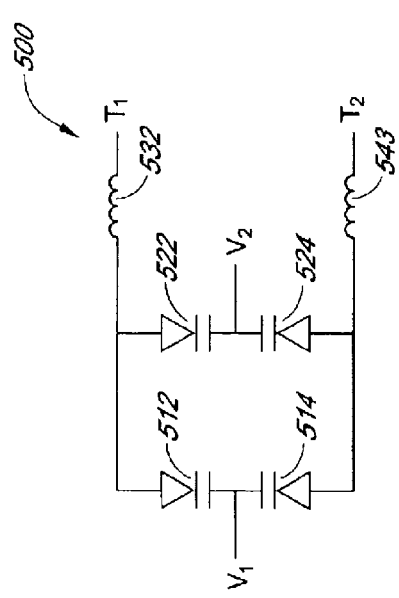
FIG. 5 is a functional block diagram of another balanced resonant circuit embodiment.

FIG. 5 shows an alternative embodiment of a balanced resonant circuit 500 that has a resonant frequency determined by an equivalent inductance in series with a capacitance. A first inductor 532 is electrically connected between a first amplifier input, T1, and the anodes of the first and third varactors, 512 and 522. The cathode of the first varactor 512 is electrically connected to the cathode of a second varactor 514 and also to the first control voltage input. The cathode of the third varactor 522 is electrically connected to the cathode of the fourth varactor 524 and also to the second control voltage input. The anodes of the second and fourth varactors, 514 and 524, are electrically connected and are also electrically connected to a second inductor 543. The opposite end of the second inductor 543 is electrically connected to the second amplifier connection. A DC path to voltage common is required from both the first and second amplifier connections such that the varactors may be reverse biased. The DC path to voltage common may be resistors from each of the first and second amplifier connections to voltage common, or may be inductors from each of the first and second amplifier connections to voltage common. In either configuration, the DC path to voltage common should not affect the quality factor or tuning capabilities of the resonant circuit 500.

Figure 6:
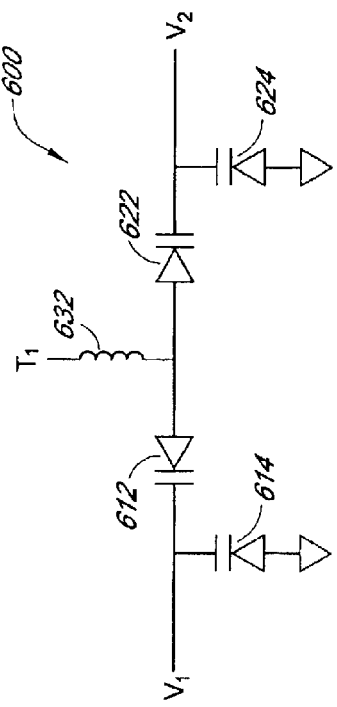
FIG. 6 is a functional block diagram of another single ended resonant circuit embodiment.

FIG. 6 shows a functional block diagram of a single-ended resonant circuit 600. The resonant frequency is determined by the series resonance of an inductor 632 with a capacitive reactance comprising varactors. An inductor 632 electrically connects the amplifier connection to the anodes of both a first varactor 612 and a third varactor 622. The cathode of the first varactor 612 is electrically connected to the first control voltage input as well as to a capacitor to voltage common. The capacitor is shown as a second varactor 614 having a cathode electrically connected to the first control voltage input and an anode electrically connected to voltage common. The cathode of the third varactor 622 is electrically connected to the second control voltage input as well as to a capacitor to voltage common. The capacitor is shown as a fourth varactor 624 having a cathode electrically connected to the second control voltage input and an anode electrically connected to voltage common. As may be appreciated, the capacitors 614 and 624 may be fixed value capacitors. Additionally, a DC path is required from the anodes of the first and third varactors, 612 and 622, to voltage common. The DC path may be supplied internal to the amplifier (not shown) or may be provided using a resistor or inductor from the anodes to voltage common (not shown). The DC path should not degrade the performance of the resonant circuit 600.

Figure 7:
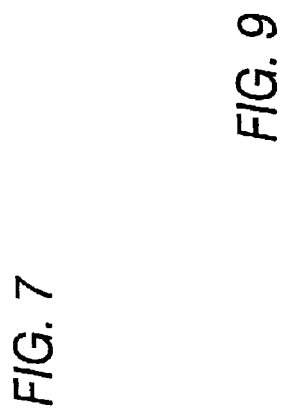
FIG. 7 is a functional block diagram of another balanced resonant circuit embodiment.

Still another balanced resonant circuit 700 embodiment is shown in FIG. 7. The resonant circuit 700 effectively has a capacitive reactance in parallel with an inductive reactance, where the inductive reactance is determined using an inductor in series with a capacitor.

A first inductor 732 is electrically connected between a first amplifier connection, T1, and the cathode of a first varactor 722. The anode of the first varactor 722 is electrically connected to a voltage common. A first resistor 762 is electrically connected between the second control voltage input and the first amplifier connection to provide a DC bias to the first varactor 722. A first coupling capacitor 742 provides an electrical connection between the first amplifier connection and the anode of a third varactor 712. The cathode of the third varactor 712 is electrically connected to the first control voltage input. A third resistor 752 is electrically connected from the anode of the third varactor 712 to voltage common to provide a DC path for the bias voltage.

A second inductor 734 is electrically connected between a second amplifier connection, T2, and the cathode of a second varactor 724. The anode of the second varactor 724 is electrically connected to a voltage common. A second resistor 764 is electrically connected between the second control voltage input and the second amplifier connection to provide a DC bias to the second varactor 724. A second coupling capacitor 744 provides an electrical connection between the second amplifier connection and the anode of a fourth varactor 714. The cathode of the fourth varactor 714 is electrically connected to the second control voltage input. A fourth resistor 754 is electrically connected from the anode of the fourth varactor 714 to voltage common to provide a DC path for the bias voltage. Additional coupling capacitors (not shown) may optionally be implemented in series with each amplifier connection to provide a DC block from the resonant circuit 700 and the amplifier.

Figure 8:
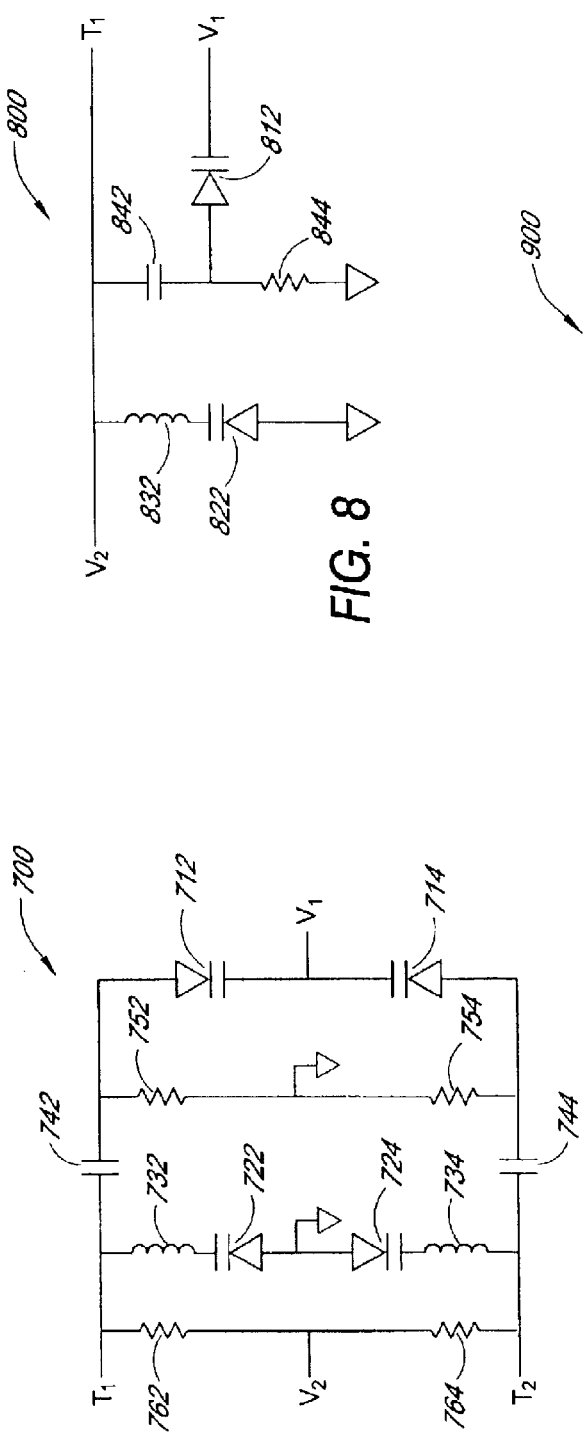
FIG. 8 is a functional block diagram of another single ended resonant circuit embodiment.

FIG. 8 shows a functional block diagram of a single-ended resonant circuit 700 equivalent to the balanced resonant circuit 700 of FIG. 7. A coupling capacitor 842 electrically connects the amplifier connection to the anode of the first varactor 812. The cathode of the first varactor 812 is electrically connected to the first control voltage input. The anode of the first varactor 812 is also electrically connected to a resistor 844 that electrically connects the anode to voltage common. An inductor 832 electrically connects the amplifier connection to the cathode of a second varactor 822. The anode of the second varactor 822 is electrically connected to voltage common. The second control voltage input is electrically connected to the amplifier input. Alternatively, the second control voltage input may be electrically connected directly to the cathode of the second varactor 822. A DC blocking capacitor (not shown) may be placed in series between the resonant circuit 800 and the amplifier connection in order to block the DC bias from the second voltage control input.

Figure 9:
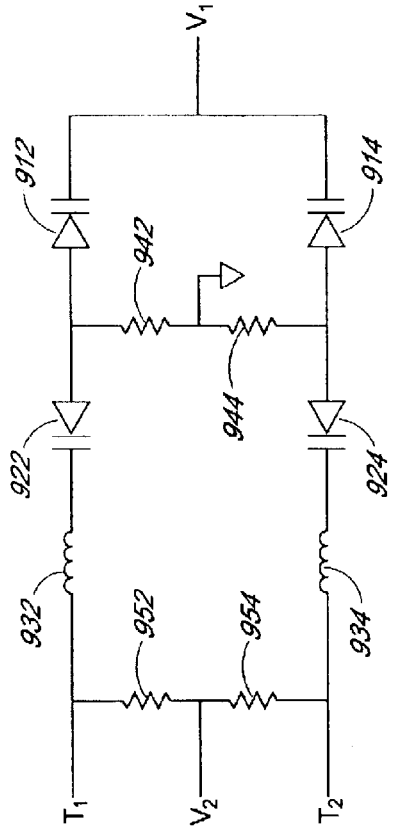
FIG. 9 is a functional block diagram of another balanced resonant circuit embodiment.

FIG. 9 depicts still another balanced resonant circuit 900 embodiment. The resonance is effectively determined by the series resonance of a capacitive reactance and an inductive reactance, where the inductive reactance is itself determined by an inductor in series with a capacitor.

A first inductor 932 electrically connects the first amplifier input to the cathode of a first varactor 922. The anode of the first varactor 922 is electrically connected to the anode of a second varactor 912. The anodes of the first and second varactors, 922 and 912, are electrically connected to voltage common using a first resistor 942. The cathode of the second varactor 912 is also electrically connected to the first control voltage input.

The first control voltage input is also connected to a cathode of a fourth varactor 914. The anode of the fourth varactor 914 is connected to the anode of a third varactor 924. The two anodes are electrically connected to voltage common using a second resistor 944. The cathode of the third varactor 924 is electrically connected to the second amplifier input by a second inductor 934. A third resistor electrically connects the second control voltage input to the first inductor to reverse bias the first varactor 922. A fourth resistor electrically connects the second control voltage input to the second inductor to reverse bias the fourth varactor 924. Additional coupling capacitors (not shown) may be placed in series between the balanced resonant circuit 900 and the first and second amplifier connections in order to block the DC control signal provided to the resonant circuit.

It may be appreciated that the resonant circuit may be implemented using parallel resonance or series resonance. Additionally, the inductive reactances may be determined by placing an inductor in series with a variable capacitor. The configuration of the resonant circuit may be balanced or single-ended. The commonality between the embodiments shown is that a first control signal may be used to set a frequency band of operation of the resonant circuit, and thus the associated VCO, and a second control signal is used to set a frequency of operation within the frequency band. The sensitivity of the frequency control signal determines the VCO gain when the band select signal is maintained at a constant value.

Those of skill in the art will understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled persons may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a mobile station, base station, or base station controller. In the alternative, the processor and the storage medium may reside as discrete components in a mobile station, base station, or base station controller.

The above description of the disclosed embodiments is provided to enable any person skilled in the art to make or use the invention. Various modifications to these embodiments will be readily apparent to those skilled in the art, and the generic principles defined herein may be applied to other embodiments without departing from the spirit or scope of the invention. Thus, the invention is not intended to be limited to the embodiments shown herein but is to be accorded the widest scope consistent with the principles and novel features disclosed herein.

What is claimed is:

1. A Voltage Controlled Oscillator (VCO) comprising:
an amplifier; and
a circuit electrically connected to the amplifier such that the amplifier produces an output signal at a resonant frequency of the circuit;
wherein the circuit receives a first control signal for determining, in part, a frequency band of the resonant frequency, and a second control signal for determining, in part, the resonant frequency within the frequency band;
wherein the circuit comprises:
a first reactance circuit, wherein a first reactance is determined by first control signal; and
a second reactance circuit electrically connected in parallel to the first reactance circuit, wherein a second reactance is determined by the second control signal,
wherein;
the first reactance circuit comprises a first varactor in series with a second varactor, a cathode of the first varactor electrically connected to a cathode of the second varactor, and wherein the first control signal is received at the electrical connection of the cathodes of the first and second varactors; and
the second reactance circuit comprises a third varactor in series with a fourth varactor, a third varactor cathode electrically connected to a fourth varactor cathode, and wherein the second control signal is received at the electrical connection of the third and fourth varactor cathodes.

2. The VCO of claim 1, wherein the first control signal selects the frequency band from a plurality frequency bands, and wherein the plurality of frequency bands includes at least two non-overlapping frequency bands.

3. The VCO of claim 1, wherein the circuit is a balanced circuit.

4. The VCO of claim 1, wherein the circuit is a single ended circuit.

5. The VCO of claim 1, wherein the circuit comprises:
an inductor;
a first variable capacitor electrically connected in parallel to the inductor, wherein the capacitance of the first variable capacitor is determined by the first control signal; and
a second variable capacitor electrically connected in parallel to the inductor, wherein the capacitance of the second variable capacitor is determined by the second control signal.

6. The VCO of claim 1, wherein the first reactance is capacitive.

7. The VCO of claim 1, further comprising an inductive reactance connected in parallel to the first and second reactances, the inductive reactance comprising:
a first inductor; and
a second inductor electrically connected in series with the first inductor;

wherein the electrical connection between the first and second inductors is electrically connected to a voltage common.

8. The VCO of claim 8, further comprising:

a first inductor having a first terminal electrically connected to an anode of the first varactor and an anode of the third varactor, a second terminal of the first inductor electrically connected to a first terminal of the amplifier; and a second inductor having a first terminal electrically connected to an anode of the second varactor and an anode of the fourth varactor, a second terminal of the second inductor electrically connected to a second terminal of the amplifier.

9. The VCO of claim 1, wherein:

the first reactance circuit comprises a first varactor, wherein the first control signal is applied to a cathode of the first varactor; and the second reactance circuit comprises a second varactor, wherein an anode of the first varactor is electrically connected to an anode of the second varactor and the second control signal is received at a cathode of the second varactor.

10. The VCO of claim 9, further comprising an inductor, wherein a first inductor terminal is electrically connected to the anodes of the first and second varactors, and a second inductor terminal is electrically connected to voltage common.

11. The VCO of claim 9, further comprising an inductor, wherein a first inductor terminal is electrically connected to the anodes of the first and second varactors, and a second inductor terminal is electrically connected to the amplifier.

* * * * *